(12) United States Patent
Aziz et al.

(10) Patent No.: US 7,352,125 B2
(45) Date of Patent: Apr. 1, 2008

(54) ORGANIC LIGHT EMITTING DEVICES WITH HOLE IMPEDING MATERIALS

(75) Inventors: Hany Aziz, Oakville (CA); Zoran D. Popovic, Mississauga (CA); Nan-Xing Hu, Oakville (CA)

(73) Assignee: LG.Philips LCD Co., Ltd., Seoul (KR)

( * ) Notice: Subject to any disclaimer, the term of this patent is extended or adjusted under 35 U.S.C. 154(b) by 0 days.

(21) Appl. No.: 11/312,695

(22) Filed: Dec. 21, 2005

(65) Prior Publication Data
US 2007/0138948 A1    Jun. 21, 2007

(51) Int. Cl.
H05B 33/00    (2006.01)
(52) U.S. Cl. ..................... 313/504; 313/506
(58) Field of Classification Search ........ 313/501–512, 313/504–506
See application file for complete search history.

(56) References Cited

U.S. PATENT DOCUMENTS

| | | | |
|---|---|---|---|
| 3,172,862 A | 3/1965 | Gurnee et al. |
| 3,530,325 A | 9/1970 | Mehl et al. |
| 4,356,429 A | 10/1982 | Tang |
| 4,539,507 A | 9/1985 | VanSlyke et al. |
| 4,720,432 A | 1/1988 | VanSlyke et al. |
| 4,769,292 A | 9/1988 | Tang et al. |
| 4,885,211 A | 12/1989 | Tang et al. |
| 5,141,671 A | 8/1992 | Bryan et al. |
| 5,150,006 A | 9/1992 | VanSlyke et al. |
| 5,151,629 A | 9/1992 | VanSlyke et al. |
| 5,227,252 A | 7/1993 | Murayama et al. |
| 5,247,190 A | 9/1993 | Friend et al. |
| 5,276,381 A | 1/1994 | Wakimoto et al. |
| 5,516,577 A | 5/1996 | Matsuura et al. |
| 5,593,788 A | 1/1997 | Shi et al. |
| 5,601,903 A | 2/1997 | Fujii et al. |
| 5,728,801 A | 3/1998 | Wu et al. |
| 5,846,666 A | 12/1998 | Hu et al. |
| 5,853,905 A | 12/1998 | So et al. |
| 5,925,980 A | 7/1999 | So et al. |
| 5,942,340 A | 8/1999 | Hu et al. |
| 5,952,115 A | 9/1999 | Hu et al. |
| 6,057,048 A | 5/2000 | Hu et al. |
| 6,114,055 A | 9/2000 | Choong et al. |
| 6,130,001 A | 10/2000 | Shi et al. |
| 6,229,012 B1 | 5/2001 | Hu et al. |
| 6,821,643 B1 | 11/2004 | Hu et al. |
| 2005/0175857 A1 | 8/2005 | Coggan |

(Continued)

FOREIGN PATENT DOCUMENTS

JP    11-273867    * 10/1999

(Continued)

OTHER PUBLICATIONS

S. A. Van Slyke et al., "Organic Electroluminescent Devices with Improved Stability", Appl. Phys. Lett. 69, (15) pp. 2160-2162 (1996).

(Continued)

*Primary Examiner*—Joseph Williams
(74) *Attorney, Agent, or Firm*—McKenna Long & Aldridge LLP (57) ABSTRACT

An organic electroluminescent device includes an anode, a cathode, and a light emitting zone including a hole transport region and an electron transport region. The hole transport region include a hole impeding material located non-adjacent the anode.

18 Claims, 5 Drawing Sheets

U.S. PATENT DOCUMENTS

2006/0061264 A1* 3/2006 Wood et al. ............. 313/504
2006/0108578 A1* 5/2006 Liu .......................... 257/40

OTHER PUBLICATIONS

Kido et al., "Organic Electroluminescent Devices Based On Molecularly Doped Polymers" Appl. Phys. Lett. 61 (7), pp. 761-763 (1992).
S. Naka et al., "Organic Electroluminescent Devices Using a Mixed Single Layer", Jpn. J. Appl. Phys. vol. 33, pp. L1772-L1774, 1994.
W. Wen et al., "Single-Layer Organic Electroluminescent devices by Vapor Deposition Polymerization", Appl. Phys. Lett. 71 (10), pp. 1302-1304 (1997).
C. Wu et al., "Efficient Organic Electroluminescent Devices Using Single-Layer Doped Polymer Thin Films with Bipolar Carrier Transport Abilities", IEEE Transactions on Electron Devices vol. 44, No. 8, pp. 1269-1281 (1997).
Y. Hamada et al., "Influence of the Emission Site on the Running Durability of Organic Electroluminescent Devices", Jpn. J. Appl. Phys. vol. 34, pp. L824-L826 (1995).
H. Aziz et al., "Degradation of Mechanism of Small Molecule-Based Organic Light-Emitting Devices", Science, (1999).
Bernius et al., "Developmental Progress of Electroluminescent Polymeric Materials and Devices" Proceedings of SPIE Conference on Organic Light Emitting Materials and Devices III, Denver, Colo., vol. 3797, pp. 129-137 (Jul. 1999).
Baldo et al., "Highly Efficient Phosphorescent Emission from Organic Electroluminescent Devices" Letters to Nature, vol. 395 (10), pp. 151-154 (1998).

* cited by examiner

ORGANIC LIGHT EMITTING DEVICES WITH HOLE IMPEDING MATERIALS

BACKGROUND OF THE INVENTION

1. Field of the Invention

This invention relates to optoelectronic devices, and more particularly, to organic light emitting devices (organic EL devices). More specifically, the present invention relates to substantially stable organic EL devices which have relatively long operational lifetime, such as at least about 1,000 hours before their luminance drops to some percent of its initial value, such as about 50 percent of the initial luminance, and which include a hole impeding material in the hole transport region.

2. Discussion of the Prior Art

An organic electroluminescent (EL) device can be comprised of a layer of an organic luminescent material interposed between an anode, typically comprised of a transparent conductor, such as indium tin oxide, and a cathode, typically a low work function metal such as magnesium, calcium, aluminum, or the alloys thereof with other metals. The EL device functions on the primary principle that under an electric field, positive charges (holes) and negative charges (electrons) are respectively injected from the anode and cathode into the luminescent material and undergo recombination to form excitonic states which subsequently emit light. A number of organic EL devices have been prepared from a laminate of an organic luminescent material and electrodes of opposite polarity, which devices include a single crystal material, such as single crystal anthracene as the luminescent substance as described, for example, in U.S. Pat. No. 3,530,325, the disclosure of which is completely incorporated herein by reference. These types of devices are believed to require excitation voltages on the order of 100 volts or greater.

An organic EL device with a multilayer structure can comprise one organic layer adjacent to the anode supporting hole transport, and another organic layer adjacent to the cathode supporting electron transport and acting as the organic luminescent zone of the device. Examples of these devices are disclosed in U.S. Pat. Nos. 4,356,429; 4,539,507; 4,720,432, and 4,769,292, the disclosures of which are completely incorporated herein by reference. In U.S. Pat. No. 4,769,292, the disclosure of which is completely incorporated herein by reference, an organic EL device comprises three separate layers, a hole transport layer, a luminescent layer, and an electron transport layer, which layers are laminated in sequence and are sandwiched between an anode and a cathode, and wherein a fluorescent dopant material is added to the emission zone or layer whereby the recombination of charges results in the excitation of the fluorescent material. In some of these multilayer structures, such as, for example, organic light emitting devices described in U.S. Pat. No. 4,720,432, the disclosure of which is completely incorporated herein by reference, the organic light emitting device further comprises a buffer layer interposed between the hole transport layer and the anode. The combination of the hole transport layer and the buffer layer forms a dual-layer hole transport region, reference S. A. Van Slyke et al., "Organic Electroluminescent Devices with Improved Stability," Appl. Phys. Lett. 69, pp. 2160-2162, 1996, the disclosure of which is completely incorporated herein by reference.

There have also been attempts to obtain electroluminescence from organic light emitting devices containing mixed layers, for example, layers in which both the hole transport material and the emitting electron transport material are mixed together in one single layer, such as in, for example, Kido et al., "Organic Electroluminescent Devices Based On Molecularly Doped Polymers," Appl. Phys. Lett. 61, pp. 761-763, 1992; S. Naka et al., "Organic Electroluminescent Devices Using a Mixed Single Layer," Jpn. J. Appl. Phys. 33, pp. L1772-L1774, 1994; W. Wen et al., Appl. Phys. Lett. 71, 1302 (1997); and C. Wu et al., "Efficient Organic Electroluminescent Devices Using Single-Layer Doped Polymer Thin Films with Bipolar Carrier Transport Abilities", IEEE Transactions on Electron Devices 44, pp. 1269-1281, 1997. In a number of these devices, the electron transport material and the emitting material can be the same or the mixed layer can further comprise an emitting material as a dopant. Other examples of organic light emitting devices which are formed of a single organic layer comprising a hole transport material and an electron transport material can be found, for example, in U.S. Pat. Nos. 5,853,905; 5,925,980; 6,114,055 and 6,130,001, the disclosures of which are completely incorporated herein by reference.

While recent progress in organic EL research has elevated the potential of organic EL devices for widespread applications, the operational stability of current available devices may in some instances be below expectations. A number of known organic light emitting devices have relatively short operational lifetimes before their luminance drops to some percentage of its initial value. Providing interface layers as described, for example, in S. A. Van Slyke et al., "Organic Electroluminescent Devices with Improved Stability," Appl. Phys. Lett. 69, pp. 2160-2162, 1996, and doping as described, for example, in Y. Hamada et al., "Influence of the Emission Site on the Running Durability of Organic Electroluminescent Devices", Jpn. J. Appl. Phys. 34, pp. L824-L826, 1995, may perhaps increase the operational lifetime of organic light emitting devices for room temperature operation, however, the effectiveness of these organic light emitting devices deteriorates for high temperature device operation.

It has been disclosed that providing a layer of CuPc as a buffer layer on the anode facilitated favorable hole injection characteristics and increased the stability of the resulting device. S. A. Van Slyke et al., "Organic Electroluminescent Devices with Improved Stability," Appl. Phys. Lett. 69, pp. 2160-2162, Appl. Phys. Lett., 1996. However, this device resulted in an unacceptable increase in voltage. H. Aziz et al., Science, 1999.; H. Aziz et al. MRS, (1999).

SUMMARY OF THE INVENTION

An exemplary embodiment of an organic electroluminescent device comprises an anode, a cathode, and a light emitting zone including a hole transport region and an electron transport region, wherein the hole transport region include a hole impeding material located non-adjacent the anode.

In an exemplary embodiment, the hole impeding material is a layer.

In an exemplary embodiment, the hole impeding material includes CuPc. In an exemplary embodiment, the hole impeding layer includes $AlQ_3$. In an exemplary embodiment, the electron transport region includes $AlQ_3$.

In an exemplary embodiment, the hole impeding material has an hole transport rate less than the hole transport rate of the hole transport material in the hole transport region.

In an exemplary embodiment, the light emitting zone is capable of emitting blue light. In an exemplary embodiment, the light emitting zone is capable of emitting red light. In an exemplary embodiment, the light emitting zone is capable of emitting green light. In an exemplary embodiment, the light emitting zone is capable of emitting white light.

In an exemplary embodiment, the hole impeding material is selected such that the luminance stability ratio is greater than about 2. In an exemplary embodiment, the hole impeding material is selected such that the luminance stability ratio is greater than about 5. In an exemplary embodiment, the hole impeding material is selected such that the luminance stability ratio is greater than about 10.

In an exemplary embodiment, the hole impeding material is arranged such that voltage is not substantially increased relative to a corresponding device without the hole impeding material.

BRIEF DESCRIPTION OF THE DRAWINGS

Preferred embodiments of this invention will be described in detail, with reference to the following figures, in which.

DETAILED DESCRIPTION OF PREFERRED EMBODIMENTS

This invention provides organic light emitting devices (OLEDs) having improved performance. Exemplary embodiments according to this invention have reduced operating voltages and also increased energy conversion efficiencies.

Exemplary embodiments of the light emitting devices according to this invention comprise an anode, a cathode and a light emission zone between the anode and cathode. The light emission zone can comprise a wide range of different organic light emitting materials.

To avoid confusion in understanding the scope of the present invention, the following guidelines can be used:

The term "layer" indicates a single coating generally having a composition that differs from the composition of an adjacent layer;

The term "region" refers to a single layer, a plurality of layers such as two, three or more layers;

The term "zone," as used in the context of the light emitting zone, refers to a single layer, a plurality of layers, a single functional area in a layer, a plurality of functional areas in a layer, or one or more regions;

Generally, all regions and layers of the display device that are between the two electrodes or that participate in the charge conduction processes needed to operate the display device are considered part of either the cathode, luminescent zone, or anode;

Generally, a layer (e.g., substrate) that does not participate in the charge conduction processes of the display device and that can be viewed as being outside of the two electrodes shall not be considered part of the electrodes; such a layer (e.g., substrate), however, still may be considered a part of the display device; and "Light emission zone," "light emitting zone," and "luminescent zone" are used interchangeably.

Figure 1:
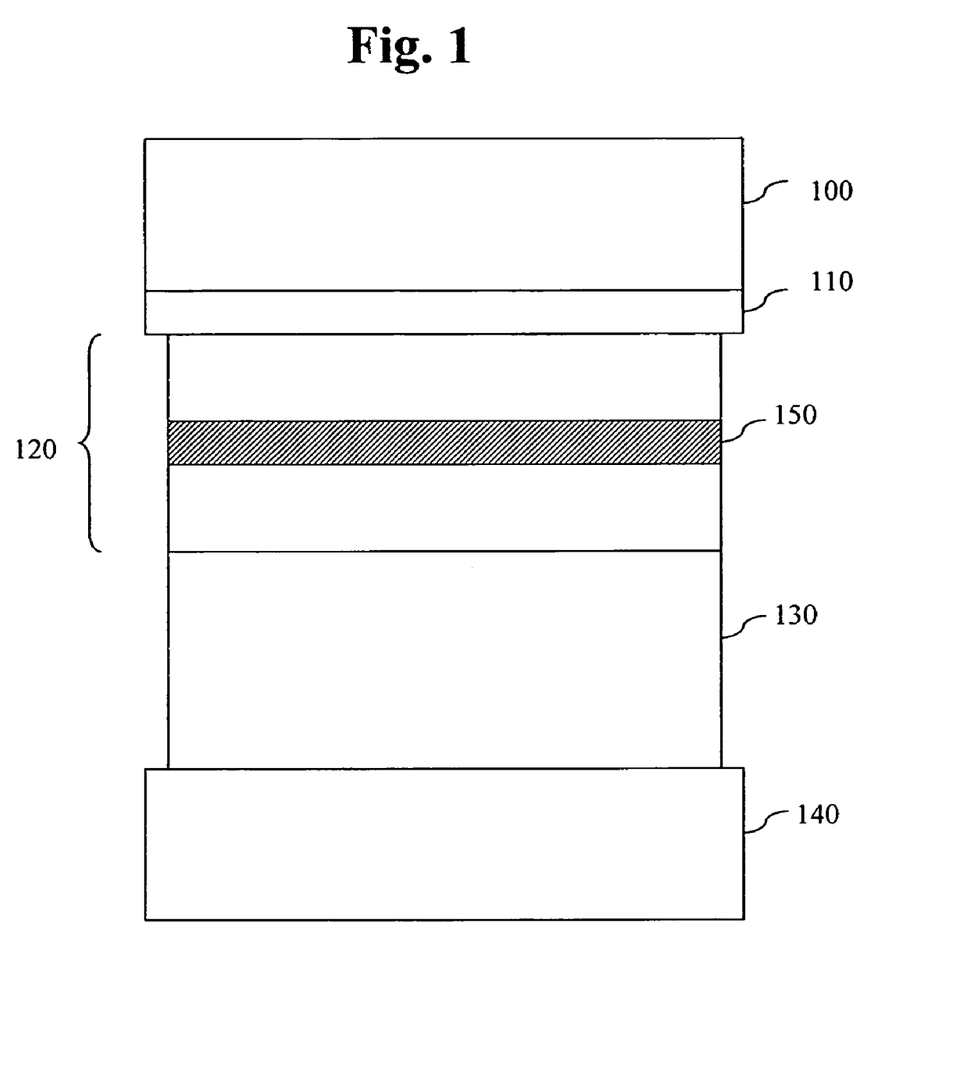
FIG. 1 illustrates an exemplary embodiment of an organic light emitting device according to this invention.

FIG. 1 illustrates an exemplary embodiment of an organic light emitting device (OLED) 1 according to this invention. The organic light emitting device 1 comprises a substrate 100; an anode 110 adjacent the substrate 100; a hole transport region 120 adjacent the anode 110; an electron transport region 130 adjacent the hole transport region 120; and a cathode 140 adjacent the electron transport region 130. Although FIG. 1 illustrates the substrate 100 adjacent the anode, in alternate embodiments, the substrate 100 can be adjacent the cathode 140.

Generally, the hole transport region 120 and electron transport region 130 are collectively referred to as the light emission or luminescent zone. During operation, an applied electric field causes positive charges (holes) and negative charges (electrons) to be respectively injected into the light emitting zone from the anode 110 and the cathode 140 to recombine and thereby produce light emission in the light emission zone.

The device 1 includes a layer, region, or doping of hole impeding material 150 in the hole transport region 120. In the exemplary embodiment, the hole impeding material 150 is not adjacent to the anode.

In general, the hole impeding material 150 is material that "slows down" the transport of holes to the electron transport region 130. As such, in general, the hole impeding material 150 has a hole transport rate less than that of the other material in the hole transport region 130. In some embodiments, the hole impeding material 150 can be any material that forms an interface with another material in the hole transport region 120 such that the interface impedes that transport of the holes to the electron transport region 130. In other embodiments, the hole impeding material 150 is considered an electron transport material with an electron transport rate at least 10 times its hole transport rate. In further embodiments, the hole impeding material 150 have an electron transport rate at least 100 times greater than its hole transport rate.

In a exemplary embodiment in which $AlQ_3$ is the electron transport material in the electron transport region 130, it is believed that the hole impeding material 150 slows down the delivery of holes to the $AlQ_3$, thus allowing an increase in the concentration $AlQ_3^-$ at the $AlQ_3$/hole transport region interface. As such, this results in a shorter lifetime of the relatively unstable $AlQ_3^+$ intermediate, and leads to increased device stability. Locating the hole impeding material non-adjacent to the anode reduces the operating voltage of the device.

As noted above in the Background, providing a buffer layer on the anode has been disclosed to increase the stability of the resulting device, but has resulted in an unacceptable increase in voltage. The present invention demonstrates that arranging a hole impeding material to be non-adjacent the anode reduces or eliminates any increase in voltage. The hole impeding material can be any distance from the anode within the hole transport region. For example, the hole impeding material can be at least about one third of the thickness of the hole transport region, at least about one half of the thickness of the hole transport region, at least about two thirds of the thickness of the hole transport region, or at least about five sixths of the thickness of the hole transport region, as measured from the anode.

The light emission zone is comprised of an organic light emitting material. Examples of suitable organic light emitting materials can be selected, for example, from metal oxinoid compounds, stilbene compounds, anthracine compounds, oxadiazole metal chelate compounds, polyfluorenes, polyphenylenevinylenes and derivatives and mixtures thereof. Other suitable organic light emitting materials are described below.

The hole transport region 120 can include suitable hole transport materials, such as, for example, polyphenylenevinylenes, polythiophenes, tertiary aromatic amines, and indolocarbazole compounds and other materials; and suitable electron transport materials, such as, for example, metal oxinoids, triazines, oxadiazole metal chelate, stilbenes, polyfluorenes and other materials.

Embodiments of the organic light emitting devices can be fabricated to emit light over a broad range of wavelengths. By the selection of suitable combinations and mixtures of the emitting materials, hole transport materials and electron transport materials, light emission can be achieved at wavelengths of from about 400 nm to about 700 nm from the organic light emitting devices. Accordingly, the organic light emitting devices of this invention can emit light having a range of different colors by appropriate material selection. This versatility of emission colors enables the organic light emitting devices of this invention to be used in various applications where certain specific light colors, such as red, green or blue are desired.

Various emitting materials, hole transport materials and electron transport materials are known in the art, as also is their combined selection to achieve desired color emissions. Furthermore, the selection of such materials to provide a desired color emission can be readily conducted by one of ordinary skill in the art using routine experimentation.

Embodiments of the organic light emitting devices can be operated under alternating current (AC) and/or direct current (DC) driving conditions. AC driving conditions may provide extended operational lifetimes.

The different portions of the organic light emitting devices according to this invention will now be described in greater detail.

The substrate 100 can comprise any suitable material. For example, the substrate 100 can comprise polymeric components, glass, quartz and the like. Suitable polymeric components include, but are not limited to, polyesters such as MYLAR™, polycarbonates, polyacrylates, polymethacrylates, polysulfones and the like. Mixtures of these various materials can also be used. Other substrate materials can also be provided that the materials can effectively support the other layers, and do not interfere with the device functional performance. The substrate 100 can formed of a light transmission material.

The thickness of the substrate 100 is not particularly limited except by the structural demands of the organic light emitting device and its intended use. The substrate can typically have a thickness, for example, of from about 25 μm to at least about 1,000 μm.

The anode 110 formed on the substrate 100 can comprise any suitable known or later developed material. For example, positive charge injecting electrodes such as indium tin oxide (ITO), tin oxide, gold and platinum can be used. Other suitable materials for the anode include, but are not limited to, electrically conductive carbon, π-conjugated polymers such as polyaniline, polypyrrole and the like having, for example, a work function of at least about 4 eV, and preferably from about 4 eV to about 6 eV.

The anode 110 can have any suitable structure. A thin conductive layer can be coated onto a light transmissive substrate, such as, for example, a transparent or substantially transparent glass plate or plastic film. Embodiments of the organic light emitting devices according to this invention can comprise a light transmissive anode formed from tin oxide or indium tin oxide (ITO) coated on a glass plate. Also, very thin light-transparent metallic anodes having a thickness, for example, of less than about 200 Å, and, preferably from about 75 Å to about 150 Å can be used. These thin anodes can comprise metals such as gold, palladium and the like. In addition, transparent or semi-transparent thin layers of conductive carbon or the above-mentioned conjugated polymers, having a thickness of, for example from 50 Å to about 175 Å can be used as anodes. Additional suitable forms of the anode 110 (and the cathode 140 as described in greater detail below) are disclosed in U.S. Pat. No. 4,885,211, which is incorporated herein by reference in its entirety.

The thickness of the anode 110 can range from about 1 nm to about 500 nm, with the exemplary thickness range depending on the optical constants of the anode material. One exemplary range of thickness of the anode is from about 30 nm to about 300 nm. Of course, thicknesses outside of this range can also be used.

The light emitting zone can comprise any suitable known or later developed one or more materials comprising an organic light emitting material. Suitable organic light emitting materials that can be utilized in the light emitting zone include the polyphenylenevinylenes, such as, for example, poly(p-phenylenevinylene) (PPV), poly(2-methoxy-5-(2-ethylhexyloxy)1,4-phenylenevinylene) (MEHPPV); poly(2,5-dialkoxyphenylenevinylene) (PDMeOPV), and other materials disclosed in U.S. Pat. No. 5,247,190, which is incorporated herein by reference in its entirety.

Other suitable organic light emitting materials that can be utilized in the light emitting zone include the polyphenylenes, such as, for example, poly(p-phenylene) (PPP), ladder-poly-para-phenylene (LPPP) and poly(tetrahydropyrene) (PTHP).

Still other suitable exemplary organic light emitting materials that can be utilized in the light emitting zone are the polyfluorenes, such as, for example, poly(9,9-di-n-octylfluorene-2,7-diyl), poly(2,8-(6,7,12,12-tetraalkylindenofluorene), and also copolymers containing fluorenes such as fluorene-amine copolymers, as described, for example, in Bernius et al., "Proceedings of SPIE Conference on Organic Light Emitting Materials and Devices III," Denver, Colo., July 1999, Vol. 3797, p. 129, which is incorporated herein by reference in its entirety.

An exemplary class of organic light emitting materials that can be utilized in the light emitting zone includes, but is not limited to, the metal oxinoid compounds as disclosed in U.S. Pat. Nos. 4,539,507; 5,151,629; 5,150,006; 5,141,671 and 5,846,666, which are each incorporated herein by reference in their entirety. Illustrative examples include tris(8-hydroxyquinolinate) aluminum ($AlQ_3$), which is one exemplary example, and bis(8-hydroxyquinolato)-(4-phenylphenolato) aluminum (BAlQ), which is another exemplary example. Other examples of this class of materials include tris(8-hydroxyquinolinate) gallium, bis(8-hydroxyquinolinate) magnesium, bis(8-hydroxyquinolinate) zinc, tris(5-methyl-8-hydroxyquinolinate) aluminum, tris(7-propyl-8-quinolinolato) aluminum, bis[benzo{f}-8-quinolinate] zinc, bis(10-hydroxybenzo[h]quinolinate) beryllium, and the like, and metal thioxinoid compounds disclosed in U.S. Pat. No. 5,846,666, such as metal thioxinoid compounds of bis(8-quinolinethiolato)zinc, bis(8-quinolinethiolato)cadmium, tris(8-quinolinethiolato)gallium, tris(8-quinolinethiolato)indium, bis(5-methylquinolinethiolato)zinc, tris(5-methylquinolinethiolato)gallium, tris(5-methylquinolinethiolato)indium, bis(5-methylquinolinethiolato)cadmium, bis(3-methylquinolinethiolato)cadmium, bis(5-methylquinolinethiolato)zinc, bis[benzo{f}-8-quinolinethiolato]zinc, bis[3-methylbenzo{f}-8-quinolinethiolato]zinc, bis[3,7-dimethylbenzo{f}-8-quinolinethiolato]zinc, and the like. Exemplary materials are bis(8-quinolinethiolato)zinc, bis(8-quinolinethiolato)cadmium, tris(8-quinolinethiolato)gallium, tris(8-quinolinethiolato)indium and bis[benzo[{f}-8-quinolinethiolato]zinc.

Another exemplary class of organic light emitting materials which can be used in the light emitting zone comprises stilbene derivatives, such as those disclosed in U.S. Pat. No. 5,516,577, incorporated herein by reference in it entirety. An exemplary stilbene derivative is 4,4'-bis(2,2-diphenylvinyl) biphenyl.

Another class of suitable organic light emitting materials for forming the light emitting zone are the oxadiazole metal chelates disclosed in co-pending U.S. patent application Ser. No. 08/829,398, filed Mar. 31, 1997, and incorporated herein by reference in its entirety. These materials include bis[2-(2-hydroxyphenyl)-5-phenyl-1,3,4-oxadiazolato]zinc; bis[2-(2-hydroxyphenyl)-5-phenyl-1,3,4-oxadiazolato]beryllium; bis[2-(2-hydroxyphenyl)-5-(1-naphthyl)-1,3,4-oxadiazolato]zinc; bis[2-(2-hydroxyphenyl)-5-(1-naphthyl)-1,3,4-oxadiazolato]beryllium; bis[5-biphenyl-2-(2-hydroxyphenyl)-1,3,4-oxadiazolato]zinc; bis[5-biphenyl-2-(2-hydroxyphenyl)-1,3,4-oxadiazolato]beryllium; bis(2-hydroxyphenyl)-5-phenyl-1,3,4-oxadiazolato]lithium; bis[2-(2-hydroxyphenyl)-5-p-tolyl-1,3,4-oxadiazolato]zinc; bis[2-(2-hydroxyphenyl)-5-p-tolyl-1,3,4-oxadiazolato] beryllium; bis[5-(p-tert-butylphenyl)-2-(2-hydroxyphenyl)-1,3,4-oxadiazolato]zinc; bis[5-(p-tert-butylphenyl)-2-(2-hydroxyphenyl)-1,3,4-oxadiazolato]beryllium; bis[2-(2-hydroxyphenyl)-5-(3-fluorophenyl)-1,3,4-oxadiazolato] zinc; bis[2-(2-hydroxyphenyl)-5-(4-fluorophenyl)-1,3,4-oxadiazolato]zinc; bis[2-(2-hydroxyphenyl)-5-(4-fluorophenyl)-1,3,4-oxadiazolato]beryllium; bis[5-(4-chlorophenyl)-2-(2-hydroxyphenyl)-1,3,4-oxadiazolato] zinc; bis[2-(2-hydroxyphenyl)-5-(4-methoxyphenyl)-1,3,4-oxadiazolato]zinc; bis[2-(2-hydroxy-4-methylphenyl)-5-phenyl-1,3,4-oxadiazolato]zinc; bis[2-.alpha.-(2-hydroxynaphthyl)-5-phenyl-1,3,4-oxadiazolato]zinc; bis[2-(2-hydroxyphenyl)-5-p-pyridyl-1,3,4-oxadiazolato]zinc; bis[2-(2-hydroxyphenyl)-5-p-pyridyl-1,3,4-oxadiazolato] beryllium; bis[2-(2-hydroxyphenyl)-5-(2-thiophenyl)-1,3,4-oxadiazolato]zinc; bis[2-(2-hydroxyphenyl)-5-phenyl-1,3,4-thiadiazolato]zinc; bis[2-(2-hydroxyphenyl)-5-phenyl-1,3,4-thiadiazolato]beryllium; bis[2-(2-hydroxyphenyl)-5-(1-naphthyl)-1,3,4-thiadiazolato]zinc; bis[2-(2-hydroxyphenyl)-5-(1-naphthyl)-1,3,4-thiadiazolato] beryllium, and the like.

Another class of suitable organic light emitting materials that can be utilized in the light emitting zone are the triazines, as disclosed in U.S. Pat. No. 6,057,048 and co-pending U.S. patent application Ser. No. 09/489,144, filed Jan. 21, 2000, which are each incorporated herein by reference in their entirety.

Another class of suitable organic light emitting materials that can be utilized in the light emitting zone are the anthracenes.

Other exemplary examples of organic light emitting materials that can be utilized in the light emitting zone are fluorescent materials, such as, for example, coumarin, dicyanomethylene pyranes, polymethine, oxabenzanthrane, xanthene, pyrylium, carbostyl, perylene, and the like. Another specially exemplary class of fluorescent materials are the quinacridone dyes. Illustrative examples of quinacridone dyes include quinacridone, 2-methylquinacridone, 2,9-dimethylquinacridone; 2-chloroquinacridone; 2-fluoroquinacridone; 1,2-benzoquinacridone; N,N'-dimethylquinacridone; N,N'-dimethyl-2-methylquinacridone; N,N'-dimethyl-2,9-dimethylquinacridone; N,N'-dimethyl-2-chloroquinacridone; N,N'-dimethyl-2-fluoroquinacridone; N,N'-dimethyl-1,2-benzoquinacridone, and the like, as disclosed in U.S. Pat. Nos. 5,227,252; 5,276,381 and 5,593,788, which are each incorporated herein in their entirety. Another exemplary class of fluorescent materials are fused ring fluorescent dyes. Examples of the fused ring fluorescent dyes include perylene, rubrene, anthracene, coronene, phenanthrecene, pyrene, and the like, as illustrated in U.S. Pat. No. 3,172,862, which is incorporated herein by reference in its entirety. Also, fluorescent materials include butadienes, such as 1,4-diphenylbutadiene and tetraphenylbutadiene, stilbenes, and the like, as disclosed in U.S. Pat. Nos. 4,356,429 and 5,516,577, which are each incorporated herein by reference in their entirety. Other exemplary fluorescent materials that can be used are disclosed in U.S. Pat. No. 5,601,903, which is incorporated herein by reference in its entirety.

Another exemplary class of organic light emitting materials that can be utilized in the light emitting zone are fluorescent dyes, as disclosed in U.S. Pat. No. 5,935,720, which is incorporated herein by reference in its entirety. Exemplary materials include, for example, 4-(dicyanomethylene)-2-1-propyl-6-(1,1,7,7-tetramethyljulolidyl-9-enyl)-4H-pyran (DCJTB).

Another exemplary class of organic light emitting materials that can be utilized in the light emitting zone are lanthanide metal chelate complexes, such as, for example, tris(acety lacetonato)(phenanthroline) terbium, tris(acetyl acetonato)(phenanthroline) europium, and tris(thenoyl trisfluoroacetonato)(phenanthroline) europium, as disclosed in Kido et al., "White Light Emitting Organic Electroluminescent Device Using Lanthanide Complexes," Jpn. J. Appl. Phys., Vol. 35, pp. L394-L396 (1996), which is incorporated herein by reference in its entirety.

Another exemplary class of organic light emitting materials that can be utilized in the light emitting zone are the phosphorescent materials, such as, for example, organometallic compounds containing heavy metal atoms that lead to strong spin-orbit coupling, such as those compounds disclosed in Baldo et. al., "Highly Efficient Organic Phosphorescent Emission from Organic Electroluminescent Devices," Letters to Nature, Vol. 395, pp 151-154 (1998). Exemplary examples include 2,3,7,8,12,13,17,18-octaethyl-21H23H-phorpine platinum(II) (PtOEP) and fac tris(2-phenylpyridine)iridium (Ir(ppy)$_3$).

Without limitation on the usefulness of the organic light emitting materials discussed herein, a blue organic light emitting material may be for example a polyfluorene, an anthracene derivative, such as those described, for example in U.S. Pat. Nos. 6,479,172, 6,562,485, 6,465,115, and 6,565,996, like 9,10-diphenylanthracene ("DPA"), 9,10-bis [4-2,2-diphenylethenyl)phyenyl]anthracene ("ADN"), and tertiary-butyl substituted 9,10-bis[4-(2,2-diphenylethenyl)

phenyl]anthracene ("TBADN" also sometimes given the acronym "BH2"), a stilbene derivative such as those described above, a triazine derivative, such as those described in U.S. Pat. No. 6,229,012, a carbazole derivative including bicarbozole derivatives, or a binaphtyl derivative, such as those described in U.S. application Ser. No. 10/774,577, filed Feb. 10, 2004. These disclosures of the cited patents and applications are fully incorporated herein by reference.

Without limitation on the usefulness of the organic light emitting materials discussed herein, a red organic light emitting material may be for example a polyfluorene, such as those mentioned above, a polyphenylene vinylene, such as MeHPPV, or others as described herein. In exemplary embodiments, certain red emitting devices utilize an electroluminescent material that by itself would emit green or blue light, but is doped with one or more red luminescent materials.

Without limitation on the usefulness of the organic light emitting materials discussed herein, a green organic light emitting material may be a polyfluorene, as those described above, a polyphenylene vinylene as those described herein, or a metal chelate such as $AlQ_3$, or others as described herein. In exemplary embodiments, certain green emitting devices utilize an electroluminescent material that by itself would emit blue light, but is doped with one or more green luminescent materials.

A light emitting zone that generates white light can, for example, comprise two or more layers where at least one layer generates blue emission and at least one layer generates yellow, orange or red emission. The one or more layers generating blue emission can, for example, comprises one or more of the blue electroluminescent materials described herein, and the one or more layers generating the yellow, orange or red emission can be comprises of any of the electroluminescent material capable of emission at the desired color range or by adding luminescent dopants, as those described herein, in a suitable electroluminescent material. Alternatively, a white emitting zone or region that generates white light can consist of a single layer comprises of a blue electroluminescent material that further includes a yellow, orange, or red luminescent dopant in a low concentration, for example less than about 2% by volume, and typically, less than about 1% by volume, and sometimes even less than about 0.5% volume, where the low concentration of dopant allows the partial retention of blue emission from the blue electroluminescent material, which when combined with the yellow, orange, or red emission components from the dopant, gives the white emission.

The hole transport material that can be utilized in the present invention can be any suitable known or later developed material.

Exemplary hole-transporting materials include polypyrrole, polyaniline, poly(phenylene vinylene), polythiophene, polyarylamine (which are disclosed in U.S. Pat. No. 5,728,801, incorporated herein by reference in its entirety) and their derivatives, and known semiconductive organic materials; porphyrin derivatives such as 1,10,15,20-tetraphenyl-21H,23H-porphyrin copper (II) disclosed in U.S. Pat. No. 4,356,429, incorporated herein by reference in its entirety; copper phthalocyanine, copper tetramethyl phthalocyanine, zinc phthalocyanine, titanium oxide phthalocyanine, magnesium phthalocyanine and the like.

An exemplary class of hole transporting materials that can be utilized are the aromatic tertiary amines such as those disclosed in U.S. Pat. No. 4,539,507, which is incorporated herein by reference in its entirety. Suitable exemplary aromatic tertiary amines include, for example, bis(4-dimethylamino-2-methylphenyl)phenylmethane; N,N,N-tri(p-tolyl)amine; 1,1-bis(4-di-p-tolylaminophenyl)cyclohexane; 1,1-bis(4-di-p-tolylaminophenyl)-4-phenyl cyclohexane; N,N'-diphenyl-N,N'-bis(3-methylphenyl)-1,1-biphenyl-4,4'-diamine; N,N'-diphenyl-N,N'-bis(3-methylphenyl)-1,1'-biphenyl-4,4'-diamine; N,N'-diphenyl-N,N'-bis(4-methoxyphenyl)-1,1'-biphenyl-4,4'-diamine, N,N,N',N'-tetra-p-tolyl-1,1'-biphenyl-4,4'-diamine; N,N'-di-1-naphthyl-N,N'-diphenyl-1,1'-biphenyl-4,4'-diamine; mixtures thereof and the like.

Another class of aromatic tertiary amines that can be utilized is the polynuclear aromatic amines. Examples of such polynuclear aromatic amines include, for example, N,N-bis-[4'-(N-phenyl-N-m-tolylamino)-4-biphenylyl]aniline; N,N-bis-[4'-(N-phenyl-N-m-tolylamino)-4-biphenylyl]-m-toluidine; N,N-bis-[4'-(N-phenyl-N-m-tolylamino)-4-biphenylyl]-p-toluidine; N,N-bis-[4'-(N-phenyl-N-p-tolylamino)-4-biphenylyl]aniline; N,N-bis-[4'-(N-phenyl-N-p-tolylamino)-4-biphenylyl]-m-toluidine; N,N-bis-[4'-(N-phenyl-N-p-tolylamino)-4-biphenylyl]-p-toluidine; N,N-bis-[4'-(N-phenyl-N-p-chlorophenylamino)-4-biphenylyl]-m-toluidine; N,N-bis-[4'-(N-phenyl-N-m-chlorophenylamino)-4-biphenylyl]-m-toluidine; N,N-bis-[4'-(N-phenyl-N-m-chlorophenylamino)-4-biphenylyl]-p-toluidine; N,N-bis-[4'-(N-phenyl-N-m-tolylamino)-4-biphenylyl]-p-chloroaniline; N,N-bis-[4'-(N-phenyl-N-p-tolylamino)-4-biphenylyl]-m-chloroaniline; N,N-bis-[4'-(N-phenyl-N-m-tolylamino)-4-biphenylyl]-1-aminonaphthalene, mixtures thereof and the like.

Another class of hole transporting materials that can be utilized is comprised of 4,4'-bis(9-carbazolyl)-1,1'-biphenyl compounds, such as, for example, 4,4'-bis(9-carbazolyl)-1,1'-biphenyl; 4,4'-bis(3-methyl-9-carbazolyl)-1,1'-biphenyl, and the like.

An exemplary class of the hole transporting materials that can be utilized is the indolo-carabazoles, such as those disclosed in U.S. Pat. Nos. 5,942,340 and 5,952,115, which are incorporated herein by reference in their entirety.

Another exemplary class of hole transporting materials that can be utilized is comprised of N,N,N'N'-tetraarylbenzidines, wherein aryl may be selected from phenyl, m-tolyl, p-tolyl, m-methoxyphenyl, p-methoxyphenyl, 1-naphthyl, 2-naphthyl and the like. Illustrative examples of N,N,N'N'-tetraarylbenzidine are N,N'-di-1-naphthyl-N,N'-diphenyl-1,1'-biphenyl-4,4'-diamine, which is more exemplary; N,N'-bis(3-methylphenyl)-N,N'-diphenyl-1,1'-biphenyl-4,4'-diamine; N,N'-bis(3-methoxyphenyl)-N,N'-diphenyl-1,1'-biphenyl-4,4'-diamine, and the like.

Exemplary hole transporting materials that can be utilized are the naphtyl-substituted benzidine derivatives.

Examples of electron transport material that can be utilized can be selected from metal oxinoid compounds, the oxadiazole metal chelate compounds, the triazine compounds and the stilbene compounds, examples of which are described above.

Other examples of electron transport material that can be utilized are the polyfluorenes, such as poly(9,9-di-n-octylfluorene-2,7-diyl), poly(2,8-(6,7,12,12-tetraalkylindenofluorene) and copolymers containing fluorenes such as fluorene-amine copolymers. See, for example, Bernius et al., "Proceedings of SPIE Conference on Organic Light Emitting Materials and Devices III," Denver, Colo., July 1999, Vol. 3797, p. 129.

A mixed region in between the hole transport region and the electron transport region can be formed using mixtures of any of the suitable exemplary hole transport materials and electron transport materials described herein.

The one or more layers comprising the light emission zone can be prepared by forming one of the above-described materials into thin films by any suitable known or later developed method. Suitable methods for this purpose include, for example, vapor deposition and spin-coating techniques.

The light emission zone can have a thickness ranging from about 10 nm to about 1000 nm. Preferably, this thickness is from about 50 nm to about 250 nm. In embodiments in which the light emission region is comprised of one or more adjacent layers, the thickness of the individual layers can be at least about 5 nm.

The cathode 140 can comprise any suitable metal, including high work function components, having a work function, for example, from about 4.0 eV to about 6.0 eV, or low work function components, such as metals with, for example, a work function of from about 2.5 eV to about 4.0 eV. The cathode can comprise a combination of a low work function (less than about 4 eV) metal and at least one other metal. Effective proportions of the low work function metal to the second or other metal are from less than about 0.1 wt. % to about 99.9 wt. %. Illustrative examples of low work function metals include, but are not limited to, alkaline metals such as lithium or sodium; Group 2A or alkaline earth metals such as beryllium, magnesium, calcium or barium; and Group III metals including rare earth metals and the actinide group metals such as scandium, yttrium, lanthanum, cerium, europium, terbium or actinium. Lithium, magnesium and calcium are exemplary low work function metals.

The Mg—Ag alloy cathodes of U.S. Pat. No. 4,885,211 are one exemplary cathode construction. Another exemplary cathode construction is described in U.S. Pat. No. 5,429,884, wherein the cathodes are formed from lithium alloys with other high work function metals such as aluminum and indium. These patents are incorporated herein by reference in their entirety.

The thickness of the cathode 140 can range from, for example, about 10 nm to about 500 nm. Of course, thicknesses outside of this range can also be used.

The hole impeding material is selected and arranged such that the luminance stability ratio of the device is any suitable value, such as, for example, greater than about 1, greater than about 2, greater than about 5, or greater than about 10. The luminance stability ratio refers to the ratio between (1) the time or operation elapsed before the luminance of the device containing the hole impeding material drops by a certain factor (e.g., 10%, 20%, 50%, etc.) of the initial luminance $L_0$ (wherein for example, $L_0$ is 100 cd/m$^2$, 300 cd/m$^2$, 500 cd/m$^2$, 1000 cd/m$^2$), and (2) the time of operation elapsed before the luminance of a comparison device (which is in all respects identical except for the absence or position of the hole impeding material) drops by the same factor when operated as the same initial luminance $L_0$, under the same testing conditions, where the test can be performed anytime after the known initial burn-in period of the devices.

EXAMPLE 1

In a first Example, the following five devices were formed and evaluated:
Device 1. N(600)/A(750)
Device 2. C(150)/N(600)/A(750)
Device 3. N(200)/C(150)/N(400)/A(750)
Device 4. N(400)/C(150)/N(200)/A(750)
Device 5. N(500)/C(150)/N(100)/A(750)

"N," "A," and "C" represent materials in the light emission zone, in the order in which they are layered from the anode to the cathode. The number in parenthesis indicates the thickness in angstroms. "N" is a naphtyl-substituted benzidine derivative, N,N'-di-1-naphthyl-N,N'-diphenyl-1,1'-biphenyl-1,1'-biphenyl-4,4'-diamine (NPB), and was used as a hole transport material in the hole transport region. "A" is tris (8-hydroxyquinoline) aluminum (AlQ$_3$), and was used as an electron transport material in the electron transport region. "C" is CuPc, and is used as a hole impeding material in the hole transport region.

Device 1 has no hole impeding material in the hole transport region; Device 2 has a hole impeding layer adjacent to the anode, and Devices 3-5 have hole impeding material in the hole transport region. Devices 1 and 2 represent prior art devices, and are included for comparison purposes.

The Devices were evaluated to determine their current density (J) versus voltage (V) and the luminance (L)/initial luminance ($L_0$) versus time characteristics.

Figure 2A:
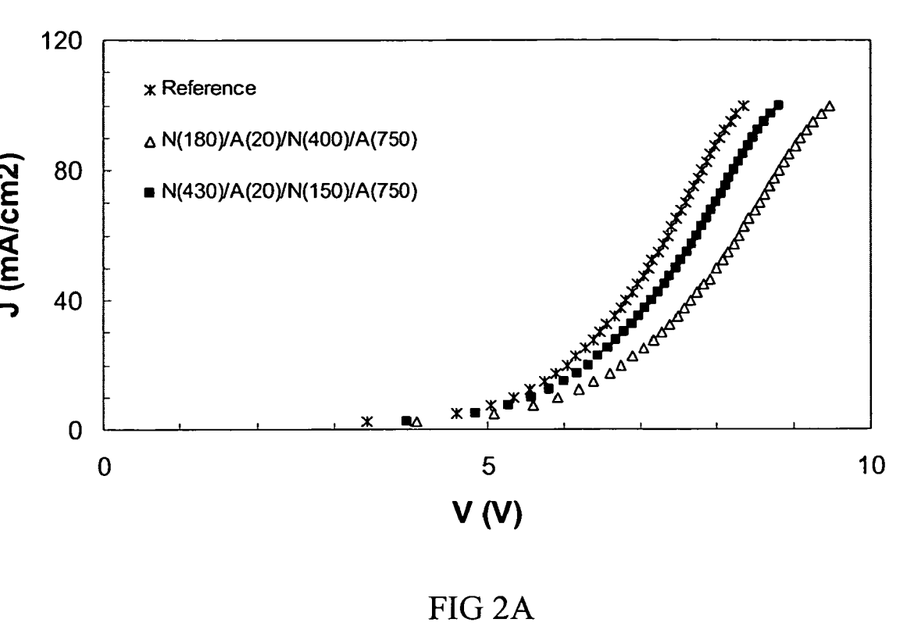
FIG. 2A illustrates the current density (J) versus voltage (V) characteristics of organic light emitting devices according to this invention and also conventional organic light emitting devices.
Figure 2B:
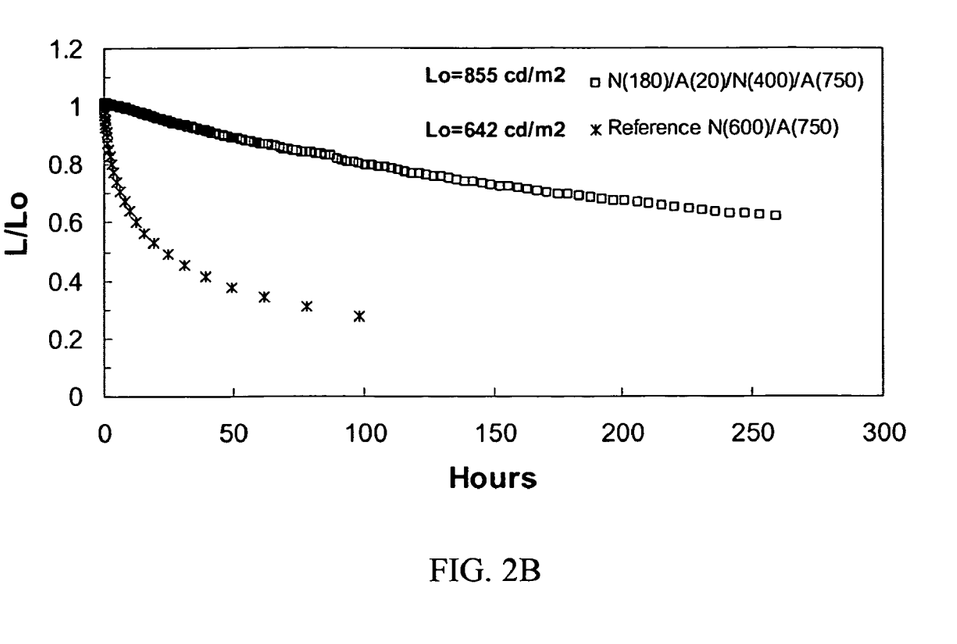
FIG. 2B illustrates the luminance (L)/initial luminance ($L_0$) versus time characteristics of an organic light emitting device according to this invention and also a conventional organic light emitting device under DC driving conditions.
Figure 3A:
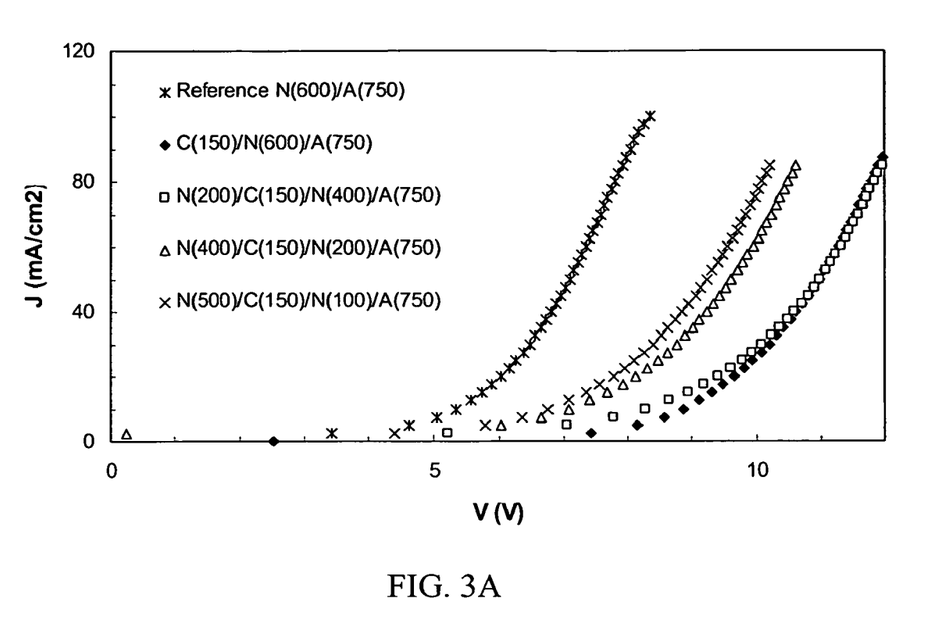
FIG. 3A illustrates the current density (J) versus voltage (V) characteristics of organic light emitting devices according to this invention and also a conventional organic light emitting device.
Figure 3B:
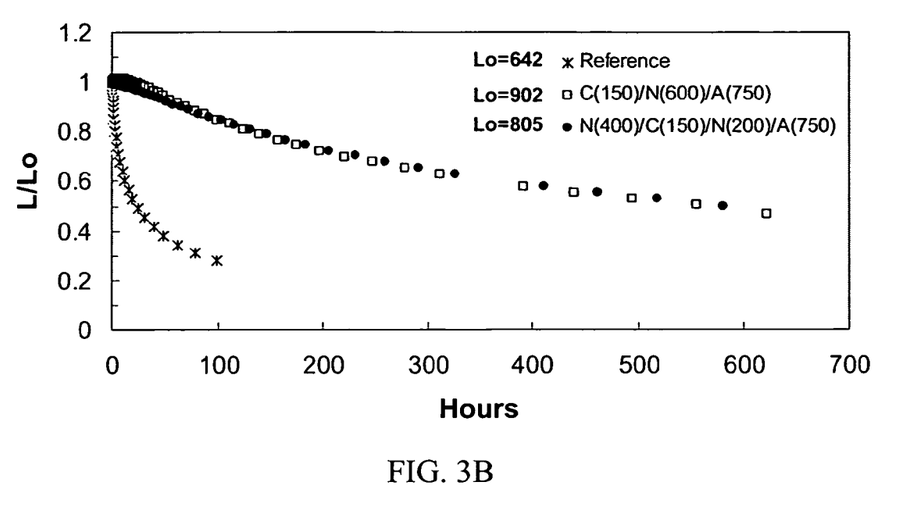
FIG. 3B illustrates the luminance (L)/initial luminance ($L_0$) versus time characteristics of an organic light emitting device according to this invention and also a conventional organic light emitting device under DC driving conditions.

As can be seen from FIGS. 3A and 2B, Device 1 demonstrated favorable current density (J) versus voltage (V) characteristics, but had an unacceptable luminance (L)/initial luminance ($L_0$) versus time characteristics. On the other hand, Device 2 demonstrated favorable luminance (L)/initial luminance ($L_0$) versus time characteristics, but had poor current density (J) versus voltage (V) characteristics. Devices 3-5, and particularly Devices 3 and 4, demonstrated favorable luminance (L)/initial luminance ($L_0$) versus time characteristics and current density (J) versus voltage (V) characteristics.

EXAMPLE 2

In a second Example, the following three devices were formed and evaluated:
Device 1. N(600)/A(750)
Device 2. N(180)/A(20)/N(400)/A(750)
Device 3. N(430)/A(20)/N(150)/A(750)

"N" and "A" represent materials in the light emission zone, in the order in which they are layered from the anode to the cathode. The number in parenthesis indicates the thickness in angstroms. "N" is a naphtyl-substituted benzidine derivative, N,N'-di-1-naphthyl-N,N'-diphenyl-1,1'-biphenyl-1,1'-biphenyl-4,4'-diamine (NPB), and was used as a hole transport material in the hole transport region. "A" is tris (8-hydroxyquinoline) aluminum (AlQ$_3$), and was used as an electron transport material in the electron transport region.

Device 1 has no hole impeding material in the hole transport region. Devices 2 and 3 have hole impeding material in the hole transport region. Device 1 represents prior art devices, and are included for comparison purposes.

The Devices were evaluated to determine their current density (J) versus voltage (V) and the luminance (L)/initial luminance ($L_0$) versus time characteristics. The Devices were tested under identical conditions.

As can be seen from FIGS. 2A and 2B, Device 1 demonstrated favorable current density (J) versus voltage (V) characteristics, but had an unacceptable luminance (L)/initial luminance ($L_0$) versus time characteristics. On the other hand, Device 2 demonstrated favorable luminance (L)/initial luminance ($L_0$) versus time characteristics and current density (J) versus voltage (V) characteristics. Similarly, Device 3 demonstrated favorable current density (J) versus voltage (V) characteristics.

The following US patent applications that are commonly owned by the assignee of the present invention can be utilized with the present invention, and are incorporated herein by reference in their entirety: Ser. Nos. 10/909,691; 10/909,689; 10/372,547; 10/702,857; 10/401,238; 11/006,000; 10/774,577; 11/133,977; 11/133,978; 11/133,975; 11/133,752; 11/122,290; 11/122,288; 11/133,753; 11/122,290; 11/122,288; 11/133,753; 11/184,775; 11/184,776.

While the invention has been described in conjunction with the specific embodiments described above, it is evident that many alternatives, modifications and variations are apparent to those skilled in the art. Accordingly, the preferred embodiments of the invention as set forth above are intended to be illustrative and not limiting. Various changes can be made without departing from the spirit and scope of the invention.

The invention claimed is:

1. An organic electroluminescent device comprising:
an anode,
a cathode, and
a light emitting zone including a hole transport region and an electron transport region, wherein the hole transport region includes at least one hole impeding material located non-adjacent the anode and within the hole transport region.

2. The device according to claim 1, wherein the at least one hole impeding material is a layer.

3. The device according to claim 1, wherein the at least one hole impeding material includes CuPc.

4. The device according to claim 1, wherein the at least one hole impeding material includes $AlQ_3$.

5. The device according to claim 1, wherein the electron transport region includes $AlQ_3$.

6. The device according to claim 1, wherein the hole transport region includes at least one hole transport material, and wherein the at least one hole impeding material has a hole transport rate less than that of the at least one hole transport material.

7. The device according to claim 1, wherein the at least one hole impeding material has an electron transport rate at least ten times greater than a hole transport rate.

8. The device according to claim 1, wherein the light emitting zone is capable of emitting blue light.

9. The device according to claim 1, wherein the light emitting zone is capable of emitting red light.

10. The device according to claim 1, wherein the light emitting zone is capable of emitting green light.

11. The device according to claim 1, wherein the light emitting zone is capable of emitting white light.

12. The device of claim 1, wherein the at least one hole impeding material is selected such that the luminance stability ratio is greater than about 2.

13. The device of claim 1, wherein the at least one hole impeding material is selected such that the luminance stability ratio is greater than about 5.

14. The device of claim 1, wherein the at least one hole impeding material is selected such that the luminance stability ratio is greater than about 10.

15. The device of claim 1, wherein the at least one hole impeding material is arranged such that voltage is not substantially increased relative to a corresponding device without the hole impeding material.

16. The device of claim 1, wherein the hole transport region has a thickness, and wherein the at least one hole impeding material is provided at a distance measured from the anode at least about one third of the thickness of the hole transport region.

17. The device of claim 1, wherein the hole transport region has a thickness, and wherein the at least one hole impeding material is provided at a distance measured from the anode at least about one half of the thickness of the hole transport region.

18. The device of claim 1, wherein the hole transport region has a thickness, and wherein the at least one hole impeding material is provided at a distance measured from the anode at least about two thirds of the thickness of the hole transport region.

* * * * *